(12) United States Patent
Callanan et al.

(10) Patent No.: US 8,354,690 B2
(45) Date of Patent: Jan. 15, 2013

(54) SOLID-STATE PINCH OFF THYRISTOR CIRCUITS

(75) Inventors: Robert J. Callanan, Raleigh, NC (US); Sei-Hyung Ryu, Cary, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 488 days.

(21) Appl. No.: 12/550,574

(22) Filed: Aug. 31, 2009

(65) Prior Publication Data

US 2011/0049561 A1  Mar. 3, 2011

(51) Int. Cl.
*H01L 29/74* (2006.01)

(52) U.S. Cl. ............... 257/121; 257/124; 257/E29.211; 257/E29.212

(58) Field of Classification Search ............ 257/121, 257/124, 119, 147, 157, E29.211, E29.221, 257/E29.212, 107
See application file for complete search history.

(56) References Cited

U.S. PATENT DOCUMENTS

| | | | |
|---|---|---|---|
| 3,439,189 A | 4/1969 | Petry | |
| 3,629,011 A | 12/1971 | Tohi et al. | |
| 3,924,024 A | 12/1975 | Naber et al. | |
| 4,160,920 A | 7/1979 | Courier de Mere | |
| 4,242,690 A | 12/1980 | Temple | |
| 4,466,172 A | 8/1984 | Batra | |
| 4,581,542 A | 4/1986 | Steigerwald | |
| 4,644,637 A | 2/1987 | Temple | |
| 4,811,065 A | 3/1989 | Cogan | |
| 4,875,083 A | 10/1989 | Palmour | |
| 4,927,772 A | 5/1990 | Arthur et al. | |
| 4,945,394 A | 7/1990 | Palmour et al. | |
| 4,946,547 A | 8/1990 | Palmour et al. | |
| 5,011,549 A | 4/1991 | Kong et al. | |
| 5,028,977 A | 7/1991 | Kenneth et al. | |
| 5,032,888 A | 7/1991 | Seki | |
| 5,111,253 A | 5/1992 | Korman et al. | |
| 5,155,289 A | 10/1992 | Bowles | |
| 5,170,231 A | 12/1992 | Fujii et al. | |
| 5,170,455 A | 12/1992 | Goossen et al. | |
| 5,184,199 A | 2/1993 | Fujii et al. | |

(Continued)

FOREIGN PATENT DOCUMENTS

DE  39 42 640 A1  8/1990

(Continued)

OTHER PUBLICATIONS

"Insulated-gate bipolar transistor." *Wikipedia, the Free Encyclopedia*. Web. Jun. 21, 2010. http://en.wikipedia.org.

(Continued)

*Primary Examiner* — Zandra Smith
*Assistant Examiner* — Paul Patton
(74) *Attorney, Agent, or Firm* — Myers Bigel Sibley & Sajovec

(57) ABSTRACT

Provided is a semiconductor bistable switching device that includes a thyristor portion including an anode layer, a drift layer, a gate layer and a cathode layer, the gate layer operable to receive a gate trigger current that, when the anode layer is positively biased relative to the cathode layer, causes the thyristor portion to latch into a conducting mode between the anode and the cathode. The device also includes a transistor portion formed on the thyristor portion, the transistor portion including a source, a drain and a transistor gate, the drain coupled to the cathode of the thyristor portion.

16 Claims, 4 Drawing Sheets

U.S. PATENT DOCUMENTS

| | | | |
|---|---|---|---|
| 5,192,987 A | 3/1993 | Khan et al. | |
| 5,200,022 A | 4/1993 | Kong et al. | |
| 5,210,051 A | 5/1993 | Carter, Jr. | |
| 5,270,554 A | 12/1993 | Palmour | |
| 5,292,501 A | 3/1994 | Degenhardt et al. | |
| 5,296,395 A | 3/1994 | Khan et al. | |
| 5,348,895 A | 9/1994 | Smayling et al. | |
| 5,371,383 A | 12/1994 | Miyata et al. | |
| 5,384,270 A | 1/1995 | Ueno | |
| 5,385,855 A | 1/1995 | Brown et al. | |
| RE34,861 E | 2/1995 | Davis et al. | |
| 5,393,993 A | 2/1995 | Edmond et al. | |
| 5,393,999 A | 2/1995 | Malhi | |
| 5,396,085 A | 3/1995 | Baliga | |
| 5,413,313 A * | 5/1995 | Mutterlein et al. | 257/137 |
| 5,459,107 A | 10/1995 | Palmour | |
| 5,468,654 A | 11/1995 | Harada | |
| 5,479,316 A | 12/1995 | Smrtic et al. | |
| 5,488,236 A | 1/1996 | Baliga et al. | |
| 5,506,421 A | 4/1996 | Palmour | |
| 5,510,281 A | 4/1996 | Ghezzo et al. | |
| 5,510,630 A | 4/1996 | Agarwal et al. | |
| 5,523,589 A | 6/1996 | Edmond et al. | |
| 5,539,217 A | 7/1996 | Edmond et al. | |
| 5,545,905 A | 8/1996 | Muraoka et al. | |
| 5,587,870 A | 12/1996 | Anderson et al. | |
| 5,629,531 A | 5/1997 | Palmour | |
| 5,710,059 A | 1/1998 | Rottner | |
| 5,726,463 A | 3/1998 | Brown et al. | |
| 5,726,469 A | 3/1998 | Chen | |
| 5,734,180 A | 3/1998 | Malhi | |
| 5,739,564 A | 4/1998 | Kosa et al. | |
| 5,763,905 A | 6/1998 | Harris | |
| 5,776,837 A | 7/1998 | Palmour | |
| 5,804,483 A | 9/1998 | Harris | |
| 5,814,859 A | 9/1998 | Ghezzo et al. | |
| 5,831,288 A | 11/1998 | Singh et al. | |
| 5,837,572 A | 11/1998 | Gardner et al. | |
| 5,851,908 A | 12/1998 | Harris et al. | |
| 5,877,041 A | 3/1999 | Fuller | |
| 5,877,045 A | 3/1999 | Kapoor | |
| 5,885,870 A | 3/1999 | Maiti et al. | |
| 5,914,500 A | 6/1999 | Bakowski et al. | |
| 5,917,203 A | 6/1999 | Bhatnagar et al. | |
| 5,939,763 A | 8/1999 | Hao et al. | |
| 5,960,289 A | 9/1999 | Tsui et al. | |
| 5,969,378 A | 10/1999 | Singh | |
| 5,972,801 A | 10/1999 | Lipkin et al. | |
| 5,976,936 A | 11/1999 | Miyajima et al. | |
| 5,977,605 A | 11/1999 | Bakowsky et al. | |
| 6,020,600 A | 2/2000 | Miyajima et al. | |
| 6,025,233 A | 2/2000 | Teresawa | |
| 6,025,608 A | 2/2000 | Harris et al. | |
| 6,028,012 A | 2/2000 | Wang | |
| 6,040,237 A | 3/2000 | Bakowski et al. | |
| 6,048,766 A | 4/2000 | Gardner et al. | |
| 6,054,352 A | 4/2000 | Ueno | |
| 6,054,728 A | 4/2000 | Harada et al. | |
| 6,063,698 A | 5/2000 | Tseng et al. | |
| 6,083,814 A | 7/2000 | Nilsson | |
| 6,096,607 A | 8/2000 | Ueno | |
| 6,100,169 A | 8/2000 | Suvorov et al. | |
| 6,104,043 A | 8/2000 | Hermansson et al. | |
| 6,107,142 A | 8/2000 | Suvorov et al. | |
| 6,117,735 A | 9/2000 | Ueno | |
| 6,121,633 A | 9/2000 | Singh et al. | |
| 6,133,587 A | 10/2000 | Takeuchi et al. | |
| 6,136,727 A | 10/2000 | Ueno | |
| 6,136,728 A | 10/2000 | Wang | |
| 6,165,822 A | 12/2000 | Okuno et al. | |
| 6,180,958 B1 | 1/2001 | Cooper, Jr. | |
| 6,190,973 B1 | 2/2001 | Berg et al. | |
| 6,204,135 B1 | 3/2001 | Peters et al. | |
| 6,204,203 B1 | 3/2001 | Narwankar et al. | |
| 6,211,035 B1 | 4/2001 | Moise et al. | |
| 6,218,254 B1 | 4/2001 | Singh et al. | |
| 6,218,680 B1 | 4/2001 | Carter, Jr. et al. | |
| 6,221,700 B1 | 4/2001 | Okuno et al. | |
| 6,228,720 B1 | 5/2001 | Kitabatake et al. | |
| 6,238,967 B1 | 5/2001 | Shiho et al. | |
| 6,239,463 B1 | 5/2001 | Williams et al. | |
| 6,239,466 B1 | 5/2001 | Elasser et al. | |
| 6,246,076 B1 | 6/2001 | Lipkin et al. | |
| 6,297,100 B1 | 10/2001 | Kumar et al. | |
| 6,297,172 B1 | 10/2001 | Kashiwagi | |
| 6,303,508 B1 | 10/2001 | Alok | |
| 6,316,791 B1 | 11/2001 | Schorner et al. | |
| 6,316,793 B1 | 11/2001 | Sheppard et al. | |
| 6,329,675 B2 | 12/2001 | Singh et al. | |
| 6,344,663 B1 | 2/2002 | Slater, Jr. et al. | |
| 6,365,932 B1 | 4/2002 | Kouno et al. | |
| 6,388,271 B1 | 5/2002 | Mitlehner et al. | |
| 6,399,996 B1 | 6/2002 | Chang et al. | |
| 6,420,225 B1 | 7/2002 | Chang et al. | |
| 6,423,986 B1 * | 7/2002 | Zhao | 257/138 |
| 6,429,041 B1 | 8/2002 | Ryu et al. | |
| 6,448,160 B1 | 9/2002 | Chang et al. | |
| 6,455,892 B1 | 9/2002 | Okuno et al. | |
| 6,475,889 B1 | 11/2002 | Ring | |
| 6,515,303 B2 | 2/2003 | Ring | |
| 6,524,900 B2 | 2/2003 | Dahlqvist et al. | |
| 6,548,333 B2 | 4/2003 | Smith | |
| 6,551,865 B2 | 4/2003 | Kumar et al. | |
| 6,573,534 B1 | 6/2003 | Kumar et al. | |
| 6,593,620 B1 | 7/2003 | Hshieh et al. | |
| 6,610,366 B2 | 8/2003 | Lipkin | |
| 6,627,539 B1 | 9/2003 | Zhao et al. | |
| 6,649,497 B2 | 11/2003 | Ring | |
| 6,653,659 B2 | 11/2003 | Ryu et al. | |
| 6,696,705 B1 | 2/2004 | Barthelmess et al. | |
| 6,703,642 B1 | 3/2004 | Shah | |
| 6,743,703 B2 | 6/2004 | Rodov et al. | |
| 6,767,843 B2 | 7/2004 | Lipkin et al. | |
| 6,861,723 B2 | 3/2005 | Willmeroth | |
| 6,933,541 B1 * | 8/2005 | Huang | 257/177 |
| 6,936,850 B2 | 8/2005 | Friedrichs et al. | |
| 6,946,739 B2 | 9/2005 | Ring | |
| 6,956,238 B2 | 10/2005 | Ryu et al. | |
| 6,979,863 B2 | 12/2005 | Ryu | |
| 7,026,650 B2 | 4/2006 | Ryu et al. | |
| 7,074,643 B2 | 7/2006 | Ryu | |
| 7,118,970 B2 | 10/2006 | Das et al. | |
| 7,125,786 B2 | 10/2006 | Ring et al. | |
| 7,221,010 B2 | 5/2007 | Ryu | |
| 7,253,031 B2 | 8/2007 | Takahashi | |
| 7,279,115 B1 | 10/2007 | Sumakeris | |
| 7,304,363 B1 | 12/2007 | Shah | |
| 7,365,363 B2 | 4/2008 | Kojima et al. | |
| 7,381,992 B2 | 6/2008 | Ryu | |
| 7,528,040 B2 | 5/2009 | Das et al. | |
| 7,544,963 B2 | 6/2009 | Saxler | |
| 7,548,112 B2 | 6/2009 | Sheppard | |
| 7,649,213 B2 | 1/2010 | Hatakeyama et al. | |
| 7,687,825 B2 | 3/2010 | Zhang | |
| 7,728,402 B2 | 6/2010 | Zhang et al. | |
| 2001/0055852 A1 | 12/2001 | Moise et al. | |
| 2002/0030191 A1 | 3/2002 | Das et al. | |
| 2002/0038891 A1 | 4/2002 | Ryu et al. | |
| 2002/0047125 A1 | 4/2002 | Fukuda et al. | |
| 2002/0072247 A1 | 6/2002 | Lipkin et al. | |
| 2002/0102358 A1 | 8/2002 | Das et al. | |
| 2002/0121641 A1 | 9/2002 | Alok et al. | |
| 2002/0125482 A1 | 9/2002 | Friedrichs et al. | |
| 2002/0125541 A1 | 9/2002 | Korec et al. | |
| 2003/0025175 A1 | 2/2003 | Asano et al. | |
| 2003/0107041 A1 | 6/2003 | Tanimoto et al. | |
| 2003/0137010 A1 | 7/2003 | Friedrichs et al. | |
| 2003/0178672 A1 | 9/2003 | Hatakeyama et al. | |
| 2003/0201455 A1 | 10/2003 | Takahashi et al. | |
| 2004/0016929 A1 | 1/2004 | Nakatsuka et al. | |
| 2004/0082116 A1 | 4/2004 | Kub et al. | |
| 2004/0183079 A1 | 9/2004 | Kaneko et al. | |
| 2004/0211980 A1 | 10/2004 | Ryu | |
| 2004/0212011 A1 | 10/2004 | Ryu | |
| 2004/0256659 A1 | 12/2004 | Kim et al. | |
| 2004/0259339 A1 | 12/2004 | Tanabe et al. | |
| 2005/0012143 A1 | 1/2005 | Tanaka et al. | |

| | | | |
|---|---|---|---|
| 2005/0104072 A1 | 5/2005 | Slater, Jr. et al. | |
| 2005/0139936 A1 | 6/2005 | Li | |
| 2005/0151138 A1 | 7/2005 | Slater, Jr. et al. | |
| 2005/0181536 A1 | 8/2005 | Tsuji, Jr. | |
| 2005/0275055 A1 | 12/2005 | Parthasarathy et al. | |
| 2006/0011128 A1 | 1/2006 | Ellison et al. | |
| 2006/0060884 A1 | 3/2006 | Ohyanagi et al. | |
| 2006/0086997 A1 | 4/2006 | Kanaya et al. | |
| 2006/0211210 A1 | 9/2006 | Bhat et al. | |
| 2006/0244010 A1 | 11/2006 | Saxler | |
| 2006/0255423 A1 | 11/2006 | Ryu et al. | |
| 2006/0261347 A1 | 11/2006 | Ryu et al. | |
| 2006/0261876 A1 | 11/2006 | Agarwal et al. | |
| 2006/0267021 A1 | 11/2006 | Rowland et al. | |
| 2007/0066039 A1 | 3/2007 | Agarwal et al. | |
| 2007/0120148 A1 | 5/2007 | Nogome | |
| 2007/0164321 A1 | 7/2007 | Sheppard | |
| 2007/0241427 A1 | 10/2007 | Mochizuki et al. | |
| 2008/0001158 A1 | 1/2008 | Das et al. | |
| 2008/0006848 A1 | 1/2008 | Chen et al. | |
| 2008/0029838 A1 | 2/2008 | Zhang et al. | |
| 2008/0105949 A1 | 5/2008 | Zhang et al. | |
| 2008/0191304 A1 | 8/2008 | Zhang et al. | |
| 2008/0230787 A1 | 9/2008 | Suzuki et al. | |
| 2008/0251793 A1 | 10/2008 | Mazzola et al. | |
| 2008/0277669 A1 | 11/2008 | Okuno et al. | |
| 2008/0296771 A1 | 12/2008 | Das et al. | |
| 2009/0121319 A1 | 5/2009 | Zhang et al. | |
| 2009/0212301 A1 | 8/2009 | Zhang et al. | |
| 2009/0289262 A1 | 11/2009 | Zhang et al. | |
| 2010/0032685 A1 | 2/2010 | Zhang et al. | |
| 2010/0133549 A1 | 6/2010 | Zhang et al. | |
| 2010/0133550 A1 | 6/2010 | Zhang et al. | |
| 2010/0140628 A1 | 6/2010 | Zhang | |
| 2010/0244047 A1 | 9/2010 | Hull et al. | |

FOREIGN PATENT DOCUMENTS

| | | |
|---|---|---|
| DE | 198 09 554 | 9/1998 |
| DE | 198 32 329 A1 | 2/1999 |
| DE | 19900171 | 7/1999 |
| DE | 10036208 A1 | 2/2002 |
| EP | 0 176 778 A2 | 4/1986 |
| EP | 0 372 412 A1 | 6/1990 |
| EP | 0 389 863 A1 | 10/1990 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | 03034466 | 2/1991 |
| JP | 03157974 | 7/1991 |
| JP | 3-225870 | 10/1991 |
| JP | 08264766 | 10/1996 |
| JP | 09205202 | 8/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2000106371 A | 4/2001 |
| JP | 2002-314099 | 10/2002 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |

OTHER PUBLICATIONS

A.K. Agarwal, J.B. Casady, L.B. Rowland, W.F. Valek, and C.D. Brandt, "1400 V 4H-SiC Power MOSFET's," *Materials Science Forum* vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," 1996 *IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PWS.Publishing Company, Boston, MA. 426-502 (1996).

Baliga "Power MOSFET" *Power Semiconductor Devices*. PWS Publishing Company,.Boston, MA 335-425 (1996).

Baliga, Power Semiconductor Devices, Chapter 7, PWS Publishing, 1996.

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Buchner et al., "Laser Recrystallization of Polysilicon for Improved Device Quality", Springer Proceedings in Physics, vol. 35, Polycrystalline Semiconductors, pp. 289-294.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2$/SiC system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc.* vol. 640, 2001.

Chen et al. "Theoretical Analysis of Current Crowding Effect in Metal/AlGaN/GaN Schottky Diodes and Its Reduction by Using Polysilicon in Anode,"Chin. Phys. Lett., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interlace trap density near athe band edges in 4H-silicon carbide metal-oxide-semiconductor capacitors," *Applied Physics Letters*. vol. 77, Nov. 27, 2000, pp. 3601-3603.

Chung et al., "The Effect of Si:C Source Ratio on $SiO_2$/SiC Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/30715.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc.*, vol. 141, 1994, pp. L150-L152.

del Prado et al. "Full Composition Range Silicon Oxynitride Films Deposited by ECR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEE Proceedings, vol. 132:6, Pt. I, pp. 257-260 (Dec. 1985).

Fukuda et al. "Improvement of $SiO_2$/4H-SiC Interface Using High-Temperature Hydrogen Annealing at Low Pressure and Vacuum Annealing," *Jpn J. Appl. Phys*. vol. 38, Apr. 1999, pp. 2306-2309.

Fukuda et al. "Improvement of $SiO_2$/4H-SiC Interface by Using High Temperature Hydrogen Annealing at 1000° C," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubel, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

J.T. Richmond, S. Ryu, A.K. Agarwal and J.W. Palmour, "Hybrid 4H-SiC MOS Gated Transistor (MGT)" (admitted prior art).

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kinoshita, et al., "Guard Ring Assisted RESURF: A New Termination Structure Providing Stable and High Breakdown Voltage for SiC Power Devices, "Tech. Digest of ISPSD '02, pp. 253-256.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of 17*th* International Symposium on Power Semiconductor Devices & IC's, 4 pages. (May 23-26, 2005). XP010820730.

Losee et al., "High-Voltage 4H-SiC PiN Rectifiers with Single-Implant, Multi-Zone JTE Termination", Power Semiconductor Devices and ICs, 2004 Proceedings. ISPSB '04. The 16*th* International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" 7*th* *European Conference on Silicon Carbide and Related Materials*, Barcelona-Spain, Sep. 7-11, 2008 retrieved from http://ecscrm08.com/invited_presentations.html, retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al.; "Electrical and microstructural properties of highly boron-implantation doped 6H-SiC", Journal of Applied Physics 89:6, pp. 3162-3167 (Mar. 15, 2001).

Pantelides et al., "Atomic-Scale Engineering of the SiC-SiO2 Interface," *Materials Science Forum*. (2000) vols. 338-342, pp. 1133-1136.

Patel, R., et al., Phosphorus-Implanted High-Voltage N. sup.+ p. 4H-SiC Junction Rectifiers, Proceedings of 1998 International Symposium on Poer Semiconductor Devices & ICs, pp. 387-390 (Kyoto).

Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N. Ion Implantations in 6H-SiC," Silicon Carbide and Related Materials. 1995 Conf, Kyoto, Japan. Published 1996.

Rao et al. "P-N. Junction Formation in 6H-SiC by Acceptor Implantation into N-Type Substrate," Nuclear Instruments and Methods in Physics Research B. vol. 106, 1995, pp. 333-338.

Rao et al. "Silane overpressure post-implant annealing of Al dopants in SiC: Cold wall CVD apparatus" *Applied Surface Science* 252: 3837-3842 (2006).

Rao, "Maturing ion-implantation technology and its device applications in SiC", *Solid State Electronics* 47:2, pp. 213-222, Elsevier Science Publishers (Feb. 2003).

Ryu et al. Article and Presentation: "27 m$\Omega$-$cm^2$, 1.6 kV Power DiMOSFETs in 4H-Sic," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.

S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.

S.M. Sze Semiconductor Devices, Physics and Technology. 2*nd* Edition, © 2002 John Wiley and Sons, p. 130.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Senzaki et al.; *Effects of Pyrogenic Reoxidation Annealing on Inversion Channel Mobility of 4H-SiC Metal-Oxide-Semiconductor Field-Effect Transistor Fabricated on* (1120) *Face*; Japanese Journal of Applied Physics, Japan Society of Applied Physics, Tokyo, JP; vol. 40, No. 11 B, Part 2; Nov. 2001; pp. L1201-L1203.

Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Streetman "Bipolar Junction Transistors" *Solid State Electronic Devices*. Prentice Hall, Englewood Cliffs, NJ. 228-284 (1980).

Sugawara et al., "3.6 kV 4H-SiC JBS Diodes with Low RonS". Materials Science Forum, vols. 338-342:2, pp. 1183-1186 (2000). XP-000944901.

Sundaresan et al., "Ultra-low resistivity Al+mplanted 4H-SiC obtained by microwave annealing and a protective graphite cap", *Solid-State Electronics* vol. 52, 2008, pp. 140-145, XP022360431.

Suzuki et al. "Effect of Post-oxidation-annealing in Hydrogen on $SiO_2$/4H-SiC Interface," *Materials Science Forum*, vols. 338-342 (2000) 1073-6.

Sze, S.M. *Physics of Semiconductor Devices*, John Wiley & Sons, p. 383-390, 1981.

Thomas et al., "Annealing of Ion Implantation Damage in SiC Using a Graphite Mask", Material Research Society Symposium Y Proceedings vol. 572, Spring 1999, pp. 45-50.

Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Vassilevski et al., "Protection of selectively implanted and patterned silicon carbide surfaces with graphite capping layer during post-implantation annealing, "Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.

Williams et al. "Passivation of the 4H-SiC/$SiO_2$ Interface with Nitric Oxide," *Materials Science Forum*. vols. 389-393 (2002), pp. 967-972.

Xu et al. "Improved Performance and Reliability of $N_2O$-Grown Oxynitride on 6H-SiH," *IEEE Electron Device Letters*. vol. 21, No. 6, Jun. 2000, p. 298-300.

Y. Li et al., "High Voltage (3 kV) UMOSFETs in 4H-SiC," *Transactions on Electron Devices*, vol. 49, No. 6, Jun. 2002.

Y. Wang, C. Weitzel, and M. Bhatnagar, "Accumulation-Mode SiC Power MOSFET Design Issues," *Materials Science Forum*, vols. 338-342, pp. 1287-1290.

Zhang et al., "A 10-kV Monolithic Darlington Transistor with βforced of 336 in 4H-SiC," IEEE Electron Device Letters, vol. 30, No. 2, pp. 142-144, XP011240662.

Zhang et al.; *Design and Fabrications of High Voltage IGBTs on 4H-SiC*; 2006 IEEE Proceedings of the 18$^{th}$ International Symposium on Power Semiconductor Devices & ICs, Napels, Italy Jun. 4-8, 2006, pp. 1-4.

Yilmaz, "Optimization and Surface Charge Sensitivity of High Voltage Blocking Structures with Shallow Junctions,"IEEE Transactions on Electron Devices, vol. 38, No. 3, Jul. 1991, pp. 1666-1675.

* cited by examiner

SOLID-STATE PINCH OFF THYRISTOR CIRCUITS

STATEMENT OF U.S. GOVERNMENT INTEREST

This invention was made with Government support under Army Research Laboratory Contract No. W911NF-04-2-0022. The Government has certain rights in the invention.

FIELD OF THE INVENTION

The present invention relates to semiconductor devices and, more particularly, to thyristor circuits.

BACKGROUND

Semiconductor bistable switches may be used in high current applications such as, for example, power supplies and/or other electrical power conversion applications. For example, thyristors may be solid-state semiconductor devices with four layers of alternating N and P-type material. Thyristors may act as bistable switches, conducting when they are forward biased and their gate receives a current pulse, and continuing to conduct as long as they are forward biased. Thyristors may generally have three states: 1) reverse blocking when voltage is applied in a direction that would be blocked by a diode; 2) forward blocking when voltage is applied in a direction that would cause a diode to conduct, but the thyristor has not been triggered into conduction; and 3) forward conducting mode when the voltage is applied in a direction that would cause a diode to conduct and a triggering current has been received at the gate. Once a thyristor is in the forward conducting mode, the device remains latched in the on-state as long as the anode remains positively biased relative to the cathode (i.e., until the anode current falls below a holding current.)

A thyristor in forward conducting mode may be switched off when an external circuit causes the anode to become negatively biased. In some applications, this may be done by switching a second thyristor to discharge a capacitor into the cathode of the first thyristor. This technique may be referred to as forced commutation. For example, a conventional gate turn off thyristor (GTO) may be turned off by either shorting or applying reverse bias to the gate to cathode junction. A large amount of current may be typically necessary to do this.

Brief reference is made to FIGS. 1a, and 1b, which are a symbol and equivalent circuit schematic diagram, respectively, of a conventional gate turn off thyristor. Although normal thyristors may not be fully controllable switches (a "fully controllable switch" can be turned on and off at will), a GTO 10 can be turned-on by a gate signal and can also be turned-off by a gate signal of negative polarity. Like a normal thyristor, GTO turn on may be accomplished by a current pulse between the gate terminal 16 and the cathode terminal 14. As the gate-cathode may behave like a PN junction, there may be some relatively small voltage between the terminals. Accordingly, the turn on phenomenon in a GTO may not be as reliable as a conventional thyristor and thus a small positive gate current may be provided even after turn on to improve reliability.

Turn off in a GTO may accomplished by applying a negative voltage pulse between the gate terminal 16 and the cathode terminal 14. Some of the forward current (about one-third to one-fifth) may be drained and used to induce a cathode-gate voltage, which in turn induces the forward current to fall and the GTO to switch off (transitioning to a blocking state.)

In addition to requiring significant currents to turn off, GTO's may suffer from long switch off times. For example, after the forward current falls, there may be a long tail time where residual current continues to flow until all remaining charge from the device is taken away.

Furthermore, a conventional GTO structure may have a maximum limit on controllable current. Additionally, in conventional thyristors, the load current can reach a point where it cannot be turned off by reverse biasing the gate. This limitation may be on the order of twice rated operating current.

Other technology may use a high power gate driver connected to turn off the thyristor by reverse biasing the gate to cathode junction. Cascode techniques have been done in the past, but cascode devices (aka Emitter-Turn-Off (ETO) thyristor) have been realized with discrete GTO thyristor in series with a discrete MOSFET. Such devices may have additional conduction losses with the discrete MOSFET and difficulty commutating the devices at high load currents and high dV/dt due to stray inductances between the MOSFET and the GTO.

GTO's with integrated turn-off switches have been proposed in the past, namely the MOS controlled thyristor (MCT). Such structures may use integrated N and P channel MOSFETs to control the thyristor structure. The PMOS transistor may be used to turn the device on and the NMOST transistor may be used to turn off the device. Turn off may be accomplished by shorting out the base to emitter junction of the NPN portion of the thyristor structure. A disadvantage of this device may be its maximum controllable current may be limited due to a finite resistance of the NMOS transistor.

SUMMARY

Some embodiments of the present invention provide semiconductor bistable switching devices. Such devices may include a thyristor portion including an anode layer, a drift layer, a gate layer and a cathode layer. The gate layer may be operable to receive a gate trigger current that, when the anode layer is positively biased relative to the cathode layer, causes the thyristor portion to latch into a conducting mode between the anode and the cathode. Devices may include a transistor portion on the thyristor portion, the transistor portion including a source, a drain and a transistor gate. The drain may be coupled to the cathode of the thyristor portion.

In some embodiments, the anode layer of the thyristor portion is operable as a switching device anode and the source of the transistor portion is operable as a switching device cathode. Some embodiments provide that the transistor gate is operable to receive a turn off signal that causes a current conducting channel between the source and the drain to increase in resistance. In some embodiments, the transistor portion includes a junction field effect transistor (JFET) that is configured to pinch off current flow from the source to the drain responsive to a voltage applied to the transistor gate.

Some embodiments provide that the thyristor portion includes a gate turn off thyristor (GTO). In some embodiments, the anode layer, drift layer, gate layer and cathode layer are disposed in a silicon carbide (SiC) layer. Some embodiments include a first external diode including a first anode that is coupled to the gate layer and a first cathode. In some embodiments, a second external diode is provided that includes a second anode that is coupled to the first cathode and a second cathode that is coupled to the drain. Some embodiments provide that the anode layer, the drift layer, the gate layer and the cathode layer, respectively include PNPN-type layers.

Some embodiments of the present invention include integrated semiconductor switching devices. Embodiments of such devices may include a thyristor anode layer having a first conductivity type and a thyristor drift layer on the anode semiconductor layer. The drift layer may have a second conductivity type that is different from the first conductivity type. A thyristor gate layer may be provided on the drift layer and may have a third conductivity type that is different from the second conductivity type. Some embodiments may include a patterned thyristor cathode layer on the gate layer. The patterned cathode layer may have a fourth conductivity type that is different from the third conductivity type. A patterned transistor drain layer may be provided on the patterned thyristor cathode layer. A patterned transistor source layer may be provided on the patterned transistor drain layer. Some embodiments may include a patterned transistor gate layer adjacent a current channel formed by at least one of the patterned transistor drain layer or the patterned transistor source layer.

In some embodiments, the patterned transistor drain layer, the patterned transistor source layer and the patterned transistor gate layer include a junction field effect transistor (JFET).

Some embodiments provide that the thyristor anode layer includes a p-type SiC layer, the thyristor drift layer includes a n-type SiC layer, the thyristor gate layer includes a p-type SiC layer and the patterned thyristor cathode layer includes a n-type SiC layer.

In some embodiments, the thyristor anode layer includes a n-type SiC layer, the thyristor drift layer includes a p-type SiC layer, the thyristor gate layer includes a n-type SiC layer and the patterned thyristor cathode layer includes a p-type SiC layer.

Some embodiments of the present invention include semiconductor bistable switching circuits. Embodiments of such circuits may include a first node corresponding to a circuit anode and electrically coupled to a thyristor portion anode. A second node corresponding to a circuit turn on gate may be electrically coupled to a thyristor portion gate. A third node corresponding to a circuit cathode may be electrically coupled to a transistor portion drain. In some embodiments, the transistor portion may include a transistor portion source that is electrically coupled to a thyristor portion cathode. Some embodiments may include a fourth node corresponding to a circuit turn off gate and electrically coupled to a transistor portion gate.

In some embodiments, the thyristor portion and the transistor portion include a monolithic device.

Some embodiments include a first semiconductor diode including a first cathode and a first anode that is electrically coupled to the second node and a second semiconductor diode including a second anode that is electrically coupled to the first cathode and a second cathode that is electrically coupled to the third node. In some embodiments, a voltage level at the second node is clamped to a voltage that corresponds to the voltage across the first semiconductor diode and the second semiconductor diode when the circuit is in a conducting state.

Some embodiments provide that the circuit is turned on from a non-conducting state between the first and third nodes to a conducting state between the first and third nodes by forward biasing the first node relative to the third node and providing a momentary bias to the second node relative to the third node. In some embodiments, the circuit is turned off from a conducting state between the first and third nodes to a non-conducting state between the first and third nodes by supplying a current to the fourth node to cause a conducting channel in the transistor portion to have increased resistance that inhibits current flow therethrough.

BRIEF DESCRIPTION OF THE DRAWINGS

The accompanying drawings, which are included to provide a further understanding of the invention and are incorporated in and constitute apart of this application, illustrate certain embodiment(s) of the invention.

DETAILED DESCRIPTION OF EMBODIMENTS OF THE INVENTION

Figure 1A:
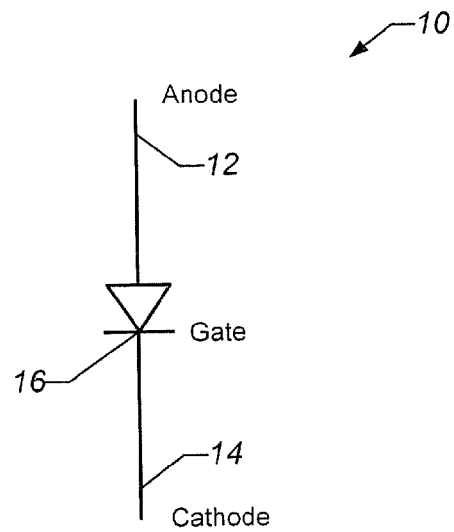
FIGS. 1a and 1b are a symbol and equivalent circuit schematic diagram, respectively, of a conventional gate turn off thyristor (GTO).
Figure 1B:
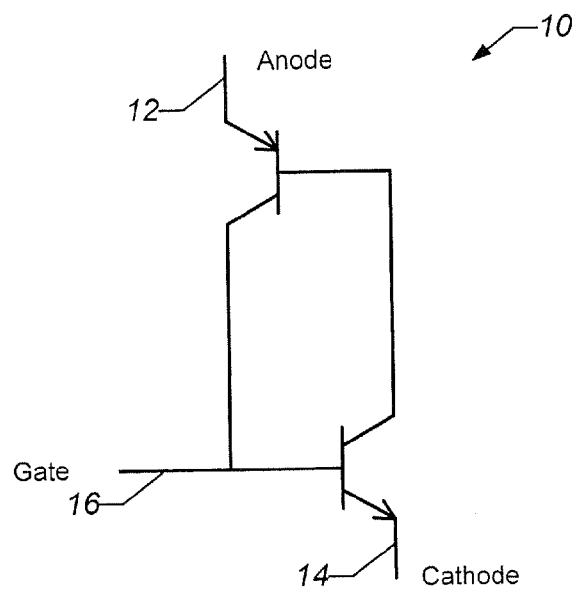

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some embodiments of the invention may be described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

Various embodiments of the present invention may arise from the present realization that high-voltage and/or high-current switching devices and/or circuits may benefit from voltage controlled and/or low current turn-off functionality. In this regard, a pinch off thyristor provides an integrated functionality of a gate turn off thyristor (GTO) and voltage and/or low-current controlled conducting channel formed on the cathode of the GTO.

Figure 2:
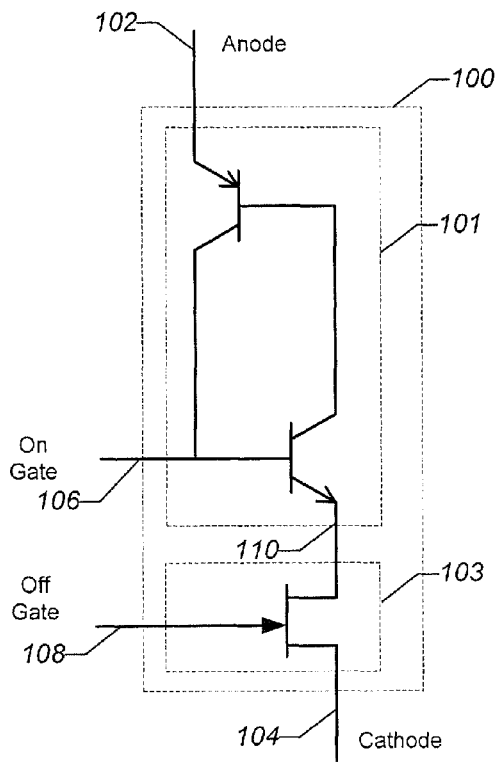
FIG. 2 is an equivalent circuit schematic diagram illustrating a semiconductor bistable switching device according to some embodiments of the present invention.

Reference is now made to FIG. 2, which is an equivalent circuit schematic diagram illustrating a semiconductor bistable switching device according to some embodiments of the present invention. In some embodiments, the switching device may include a thyristor portion 101 that is serially connected to a transistor portion 103. In some embodiments, the thyristor portion 101 and the transistor portion 103 may be integrated into a monolithic device. Some embodiments provide that the switching device 100 includes terminals and/or nodes corresponding to an anode 102, an on gate 106, an off gate 108 and a cathode 104.

As illustrated, the thyristor portion 101 may be understood in terms of a tightly coupled pair of bipolar junction transistors (BJT's) that are arranged to cause a self-latching operation. For example, the thyristor portion 101 may include a four layer semiconductor device consisting of alternately n-type or p-type material (e.g., N-P-N-P and/or P-N-P-N). Some embodiments provide that the four layers include an anode layer, a drift layer, a gate layer and a cathode layer. In some embodiments, anode layer, drift layer, gate layer and cathode layer are formed using silicon carbide (SiC), silicon (Si), gallium nitride (GaN) and/or diamond, among others. The thyristor portion 101 may include a thyristor anode corresponding to the anode 102 and a thyristor cathode corresponding to an intermediate node 110 that includes the coupling between the thyristor portion 101 and the transistor portion 103. Some embodiments provide that the thyristor anode and thyristor cathode may be across the four semiconductor layers. In some embodiments, the thyristor portion 101 may include a gate turn off thyristor (GTO). The thyristor portion 101 may include a thyristor gate corresponding to the on gate 106 that is connected to the semiconductor layer adjacent the thyristor cathode layer.

In some embodiments, the transistor portion 103 may include a normally on field effect device that includes a current channel that can be pinched off responsive to an off gate signal. For example, some embodiments provide that the transistor portion 103 includes a transistor gate (turn off gate 108) that is operable to receive a turn off signal that causes a current conducting channel between a transistor source and drain to increase in resistance. Some embodiments provide that the transistor portion may include a junction field effect transistor (JFET) formed using silicon carbide (SiC), silicon (Si), gallium nitride (GaN) and/or diamond, among others.

For example, some embodiments provide that the transistor portion 103 may include a drain that is connected to the thyristor portion 101 at the intermediate node 110, a transistor gate that corresponds to the off gate 108, and a transistor source that corresponds to the cathode 104.

In use and operation of some embodiments described herein, turning on the switching device 100 may be accomplished by forward biasing the base to emitter junction. Some embodiments provide that this may be accomplished by providing a momentary current pulse at the on gate 106 when the anode 102 is positively biased relative to the cathode 104. As the transistor portion 103 may be a normally on device, the thyristor cathode may be at the same potential as the cathode 104, and current flows from the drain to the source via a current channel therebetween. The switching device 100 remains latched in a conducting state as long as the anode 102 is positively biased relative to the cathode and no signals are received at either of the on gate 106 or the off gate 108.

The switching device 100 may be turned off by negatively biasing the off gate 108 (the transistor portion gate) relative to the cathode 104 (the transistor portion source). The negative bias has the effect of pinching off the load current flowing through the transistor portion 103 at the cathode 104. In this manner, the load current may be commutated to the on gate 106, which rapidly turns off the thyristor portion 101 of the switching device 100.

Figure 3:
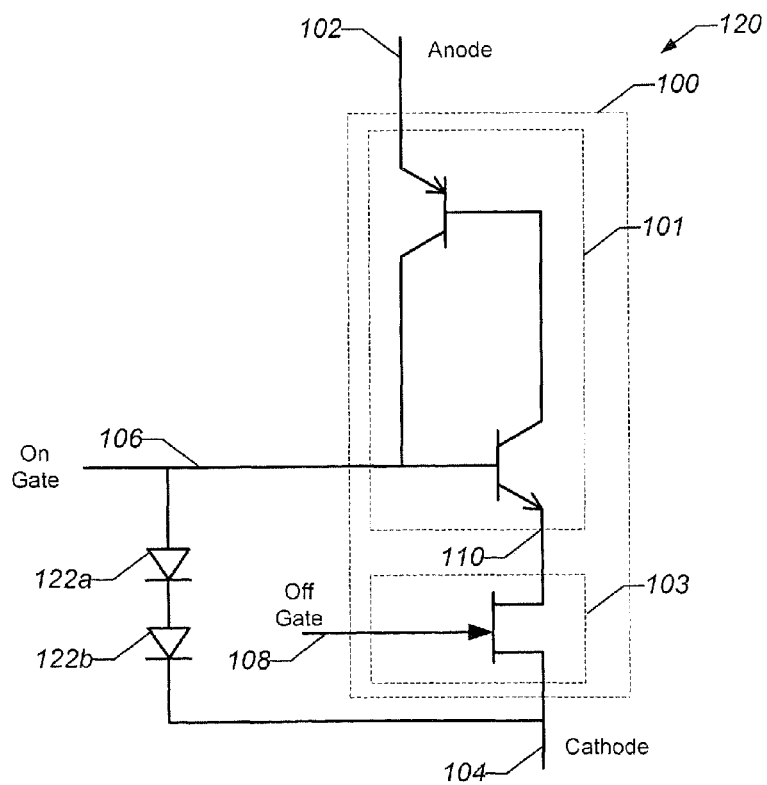
FIG. 3 is an equivalent circuit schematic diagram illustrating a semiconductor bistable switching circuit according to some embodiments of the present invention.

Reference is now made to FIG. 3, which is an equivalent circuit schematic diagram illustrating a semiconductor bistable switching circuit according to some embodiments of the present invention. The switching circuit 120 includes a switching device 100 as discussed above regarding FIG. 2. Accordingly, redundant portions of discussion of the switching device 100 are not provided in the forgoing description.

In some embodiments, the switching circuit 120 includes diodes 122a and 122b that are external to the switching device 100 and serially connected between the on gate 106 and the cathode 104. For example, some embodiments provide that a first diode 122a may include a first anode that is coupled to the on gate 106 and a cathode that is coupled to an anode of the second diode 122b. The second diode 122b may include a cathode that is coupled to the cathode 104. In this manner, the externally connected diodes 122a and 122b may be used to clamp the on gate 106 to a voltage above the cathode that corresponds to the voltage drop of two serially connected diodes. Accordingly, a path for the load current may be provided during commutation when the current channel is pinched off. Some embodiments provide that, as very little power at the transistor gate is used by the transistor portion 103, a voltage supplying a very small current may be sufficient as a turn off signal.

Figure 4:
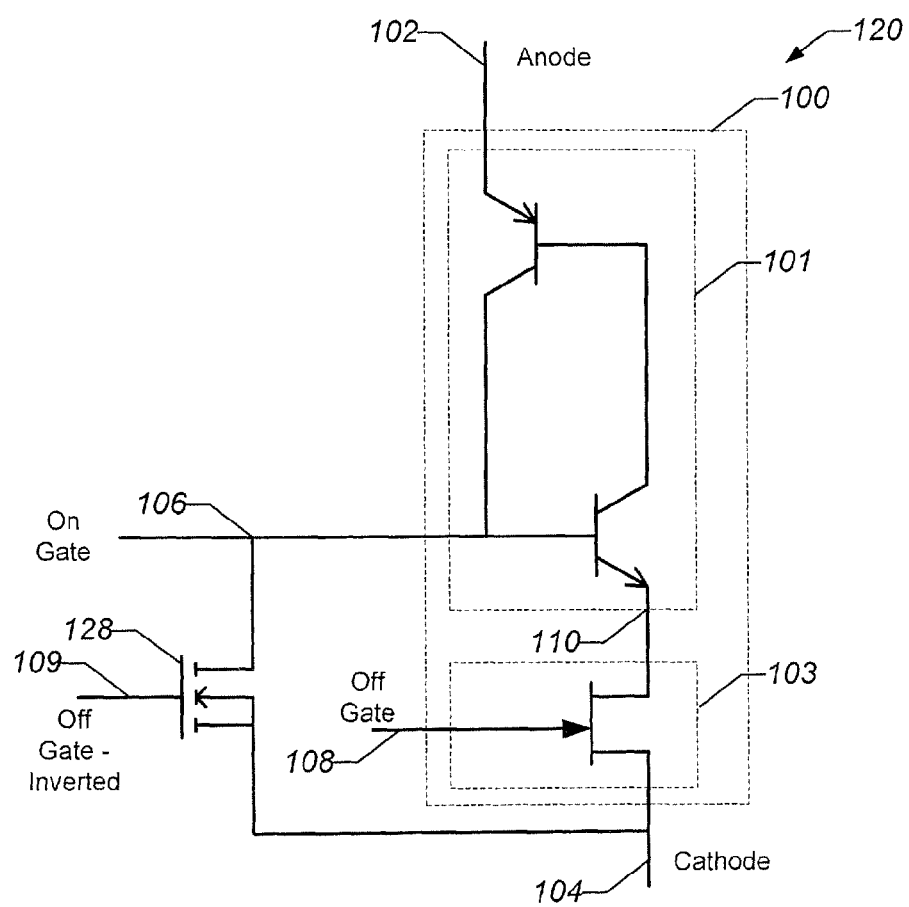
FIG. 4 is an equivalent circuit schematic diagram illustrating a semiconductor bistable switching circuit according to some embodiments of the present invention.

Reference is now made to FIG. 4, which is an equivalent circuit schematic diagram illustrating a semiconductor bistable switching circuit according to some embodiments of the present invention. The switching circuit 120 includes a switching device 100 as discussed above regarding FIG. 2. Accordingly, redundant portions of discussion of the switching device 100 are not provided in the forgoing description.

In some embodiments, the switching circuit 120 includes a switch 128 that may be external to the switching device 100 and be connected between the on gate 106 and the cathode 104. For example, some embodiments provide that the switch 128 may include a metal oxide semiconductor field effect transistor (MOSFET) and/or a bipolar junction transistor (BJT) formed of SiC, Si, GaN and/or diamond, among others. In this manner, the externally connected switch 128 may be used to turn off the switching circuit by negatively biasing the off gate 108 and positively biasing the inverted off gate 109.

Thus, the transistor portion 103 is turned off and the switch 128 is turned on. Accordingly, the cathode current may flow through the on gate 106 and the switch 128 to provide rapid commutation. Accordingly, a path for the load current may be provided during commutation when the current channel is pinched off. Some embodiments provide that, as very little power at the transistor gate is used by the transistor portion 103, a voltage supplying a very small current may be sufficient as a turn off signal.

Additionally, the transistor portion 103 may provide an advantage in that the structure may have a maximum current that it can pass, which may be referred to as IDSS. Some embodiments provide that during fault conditions, a load current may exceed IDSS and the transistor may transition from a triode (ohmic) operation to a saturated (current limited) operation. In some embodiments, this may cause the voltage across the transistor portion 103 to rapidly rise, which may reverse bias the base to emitter junction of the thyristor portion 101. As a result, the thyristor portion may be rapidly driven into a non-conducting or turned off state.

Additionally, some embodiments provide that the transistor portion may be exploited to provide a positive temperature coefficient on the anode to cathode voltage drop of the switching circuit during conduction.

Figure 5A:
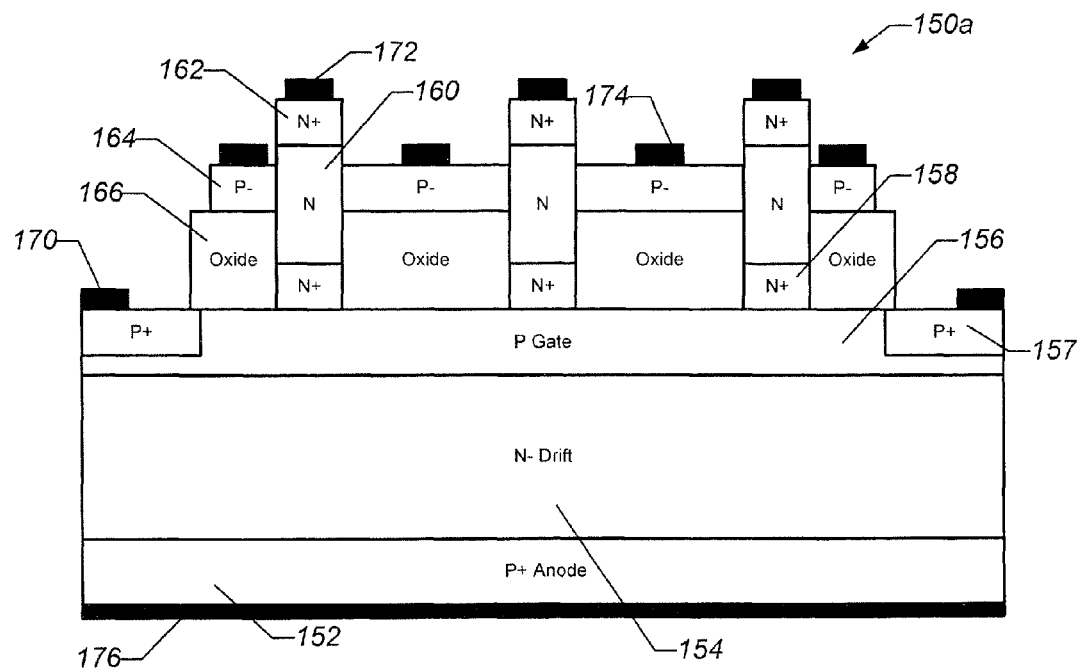
FIGS. 5a and 5b are different conductivity types of integrated semiconductor switching devices in accordance with some embodiments of the present invention.
Figure 5B:
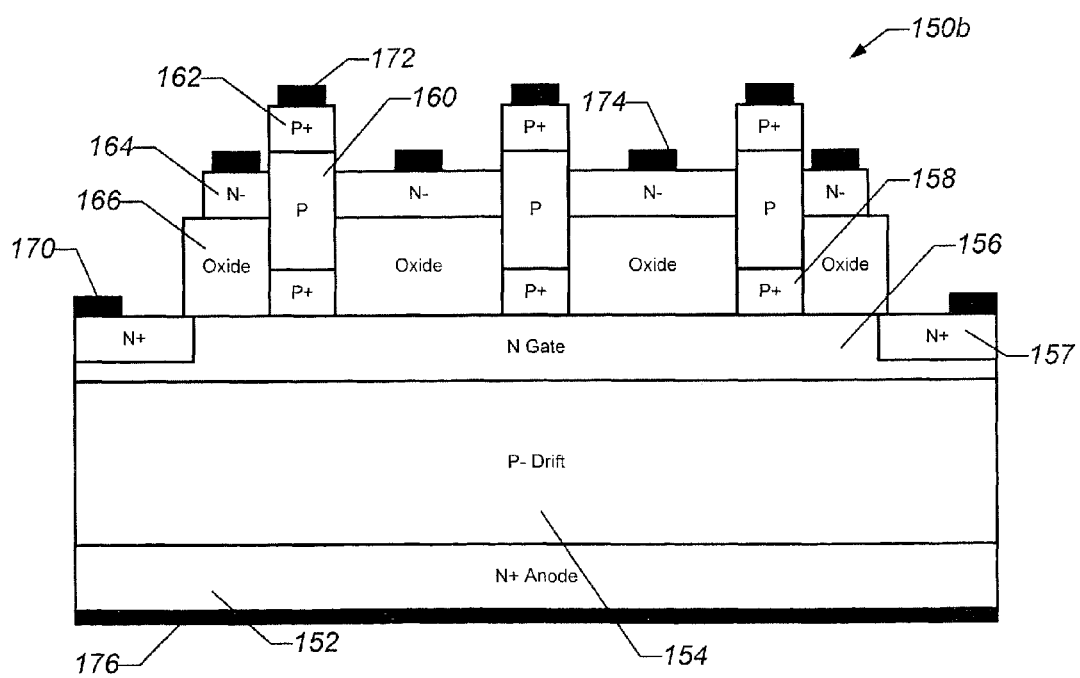

Reference is now made to FIGS. 5a and 5b, which are different conductivity types of integrated semiconductor switching devices in accordance with some embodiments of the present invention. Referring to FIG. 5a, an integrated semiconductor switching device 150a includes a thyristor anode layer 152 having a first conductivity type. In some embodiments, an anode ohmic layer and/or anode contact 176 may be formed on a first side of the thyristor anode layer 152. Some embodiments provide that a thyristor drift layer 154 may be formed on a second side of the thyristor anode layer 152 and may have a different conductivity that the thyristor anode layer 152.

In some embodiments, a thyristor gate layer 156 may be formed on the thyristor drift layer 154 and may have a different conductivity than the thyristor gate layer 154. A patterned thyristor cathode layer 158 may be formed on the thyristor gate layer 156. Contact wells 157 may be formed in the thyristor gate layer 156, upon which turn on ohmic pads and/or turn on contacts 170 may be formed. Some embodiments provide that the thyristor anode layer 152, thyristor drift layer 154, thyristor gate layer 156 and the patterned thyristor cathode layer 158 may collectively operate as a GTO.

Some embodiments provide that a patterned transistor drain layer 160 is formed on the patterned thyristor cathode layer 158 and a patterned transistor source layer 162 is formed on the patterned transistor drain layer 160. A patterned transistor gate layer 164 may be formed adjacent a current channel formed by at least one of the patterned transistor drain layer 160 and/or the patterned transistor source layer 162. A patterned oxide layer 166 may be formed between the patterned transistor gate layer 164 and the thyristor gate layer 156. Some embodiments provide that the patterned oxide layer 166 may provide electrical insulation between the patterned transistor gate layer 164 and the thyristor gate layer 156. Cathode ohmic pads and/or cathode contacts 172 may be formed on the patterned transistor source layer 162. Turn off ohmic pads and/or turn off contacts 174 may be formed on the patterned transistor gate layer 164. In some embodiments, the patterned transistor drain, source and gate layers 160, 162 and 164 may be operable to function as a junction field effect transistor (JFET).

As illustrated in FIG. 5a, some embodiments provide that the thyristor anode layer 152 is a p+ type conductivity SiC layer and the thyristor drift layer 154 is a n− type conductivity SiC layer. The thyristor gate layer 156 may be a p type conductivity SiC layer and the patterned thyristor cathode layer 158 may be a n+ type conductivity SiC layer. The patterned transistor drain layer 160 may be a n type conductivity SiC layer and the patterned transistor source layer 162 may be a n+ type conductivity SiC layer. In some embodiments, the patterned transistor gate layer 164 may be a p− polysilicon layer.

In use and operation of some embodiments provided herein, when the anode contact 176 is positively biased relative to the cathode contact 172 and a turn on voltage is momentarily applied to the turn on contact 170, current begins flowing from the anode contact 176 through the thyristor layers 152, 154, 156 and 158 and through the patterned transistor layers 160 and 162, which may provide a current channel. The thyristor layers may continue to conduct until a voltage is applied to the turn off contact 174, which increases the resistance in the current channel and thus pinches off the current flow through the patterned transistor layers 160 and 162. Once the current flow is pinched off, the thyristor anode layer 152 ceases to become positively biased relative to the thyristor cathode layer 158.

Although FIG. 5a illustrates thyristor layers 152, 154, 156 and 158 in a specific conductivity arrangement, namely, a PNPN configuration, as illustrated in FIG. 5b, the integrated semiconductor switching device 150b may include thyristor layers 152, 154, 156 and 158 in a NPNP configuration. Some embodiments provide that the transistor layers 160, 162 and 164 may include a conductivity arrangement corresponding to that of the thyristor layers 152, 154, 156 and 158. For example, in some embodiments, the transistor layers 160, 162 and 164 may be p-type, p-type and n-type, respectively.

Some embodiments provide that the thyristor anode layer 152 may be a n+ type conductivity silicon carbide (SiC) layer and the thyristor drift layer 154 may be a p− type conductivity SiC layer. The thyristor gate layer 156 may be a n type conductivity SiC layer and the patterned thyristor cathode layer 158 may be a p+ type conductivity SiC layer. The patterned transistor drain layer 160 may be a p type conductivity SiC layer and the patterned transistor source layer 162 may be a p+ type conductivity SiC layer. In some embodiments, the patterned transistor gate layer 164 may be a n− polysilicon layer.

With regard to the carrier concentrations, the p+, p−, n+ and n− conductivity type regions and/or layers described above may be as heavily doped as possible without causing excessive fabrication defects. Suitable dopants for producing p type SiC regions and/or layers include, for example, aluminum, boron and/or gallium, among others. Suitable dopants for producing the n type SiC regions and/or layers include, for example, nitrogen and/or phosphorous, among others.

Although not illustrated herein, multiple ones of the semiconductor switching devices and/or semiconductor bistable switching circuit described herein may be used in combination with one another in applications where voltage and/or current requirements may exceed the capacity a single device and/or circuit. For example, if a voltage requirement exceeds the voltage of a singe device and/or circuit, multiple devices may be arranged in series. Further, if a current carrying requirement exceeds the capacity of a single device and/or circuit, multiple devices may be arranged in a parallel configuration.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor bistable switching device comprising:
   a thyristor portion including an anode layer, a drift layer, a gate layer and a cathode layer, the gate layer is operable to receive a gate trigger current that, when the anode layer is positively biased relative to the cathode layer, causes the thyristor portion to latch into a conducting mode between the anode and the cathode; and
   a transistor portion on the thyristor portion, the transistor portion including a source, a drain and a transistor gate, the drain is coupled to the cathode of the thyristor portion,
   wherein the thyristor portion and the transistor portion are integrated into a monolithic device.

2. The device according to claim 1, wherein the anode layer of the thyristor portion is operable as a switching device anode and wherein the source of the transistor portion is operable as a switching device cathode.

3. The device according to claim 1, wherein the transistor gate is operable to receive a turn off signal that causes a current conducting channel between the source and the drain to increase in resistance.

4. The device according to claim 1, wherein the transistor portion comprises a junction field effect transistor (JFET) that is configured to pinch off current flow from the source to the drain responsive to a voltage applied to the transistor gate.

5. The device according to claim 1, wherein the thyristor portion comprises a gate turn off thyristor (GTO).

6. The device according to claim 1, wherein the anode layer, drift layer, gate layer and cathode layer are disposed in a silicon carbide (SiC) layer.

7. The device according to claim 1, further comprising:
   a first external diode including a first anode that is coupled to the gate layer and a first cathode; and
   a second external diode including a second anode that is coupled to the first cathode and a second cathode that is coupled to the drain.

8. The device according to claim 1, wherein the anode layer, the drift layer, the gate layer and the cathode layer, respectively comprise PNPN-type layers.

9. An integrated semiconductor switching device comprising:
   a thyristor anode layer having a first conductivity type;
   a thyristor drift layer on the anode semiconductor layer, the drift layer having a second conductivity type that is different from the first conductivity type;
   a thyristor gate layer on the drift layer, the gate layer having a third conductivity type that is different from the second conductivity type;
   a patterned thyristor cathode layer on the gate layer, the patterned cathode layer having a fourth conductivity type that is different from the third conductivity type;
   a patterned transistor drain layer on the patterned thyristor cathode layer;
   a patterned transistor source layer on the patterned transistor drain layer; and
   a patterned transistor gate layer adjacent a current channel formed by at least one of the patterned transistor drain layer or the patterned transistor source layer.

10. The device according to claim 9, wherein the patterned transistor drain layer, the patterned transistor source layer and the patterned transistor gate layer comprise a junction field effect transistor (JFET).

11. The device according to claim 9,
   wherein the thyristor anode layer comprises a p-type SiC layer,
   wherein the thyristor drift layer comprises a n-type SiC layer;
   wherein the thyristor gate layer comprises a p-type SiC layer; and
   wherein the patterned thyristor cathode layer comprises a n-type SiC layer.

12. The device according to claim 9,
   wherein the thyristor anode layer comprises a n-type SiC layer;
   wherein the thyristor drift layer comprises a p-type SiC layer;
   wherein the thyristor gate layer comprises a n-type SiC layer; and
   wherein the patterned thyristor cathode layer comprises a p-type SiC layer.

13. A semiconductor bistable switching circuit comprising:
   a first node corresponding to a circuit anode and electrically coupled to a thyristor portion anode;
   a second node corresponding to a circuit turn on gate and electrically coupled to a thyristor portion gate;
   a third node corresponding to a circuit cathode and electrically coupled to a transistor portion drain, the transistor portion including a transistor portion source that is electrically coupled to a thyristor portion cathode; and
   a fourth node corresponding to a circuit turn off gate and electrically coupled to a transistor portion gate,
   wherein the thyristor portion and the transistor portion comprise a monolithic device.

14. The circuit according to claim 13, further comprising:
   a first semiconductor diode including a first cathode and a first anode that is electrically coupled to the second node; and
   a second semiconductor diode including a second anode that is electrically coupled to the first cathode and a second cathode that is electrically coupled to the third node,
   wherein a voltage level at the second node is clamped to a voltage that corresponds to the voltage across the first semiconductor diode and the second semiconductor diode when the circuit is in a conducting state.

15. The circuit according to claim 13, wherein the circuit is turned on from a non-conducting state between the first and third nodes to a conducting state between the first and third nodes by forward biasing the first node relative to the third node and providing a momentary bias to the second node relative to the third node.

16. The circuit according to claim 13, wherein the circuit is turned off from a conducting state between the first and third nodes to a non-conducting state between the first and third nodes by supplying a current to the fourth node to cause a conducting channel in the transistor portion to have increased resistance that inhibits current flow therethrough.

* * * * *